United States Patent
Li et al.

(10) Patent No.: US 10,414,975 B2
(45) Date of Patent: Sep. 17, 2019

(54) ORANGE-YELLOW-EMITTING PHOSPHOR FOR LEDS, PREPARATION METHOD AND USE THEREOF

(71) Applicant: Changchun Institute of Applied Chemistry Chinese Academy of Sciences, Jilin (CN)

(72) Inventors: Chengyu Li, Jilin (CN); Wenzhi Sun, Jilin (CN); Ran Pang, Jilin (CN); Lihong Jiang, Jilin (CN); Su Zhang, Jilin (CN)

(73) Assignee: Changchun Institute of Applied Chemistry Chinese Academy of Sciences, Jilin (CN)

( * ) Notice: Subject to any disclaimer, the term of this patent is extended or adjusted under 35 U.S.C. 154(b) by 0 days.

(21) Appl. No.: 15/329,390

(22) PCT Filed: Nov. 16, 2015

(86) PCT No.: PCT/CN2015/094654
§ 371 (c)(1),
(2) Date: Jan. 26, 2017

(87) PCT Pub. No.: WO2017/035954
PCT Pub. Date: Mar. 9, 2017

(65) Prior Publication Data
US 2018/0194998 A1    Jul. 12, 2018

(30) Foreign Application Priority Data
Sep. 2, 2015 (CN) .......................... 2015 1 0556027

(51) Int. Cl.
*C09K 11/77* (2006.01)
*C09K 11/71* (2006.01)
*H01L 33/50* (2010.01)

(52) U.S. Cl.
CPC .......... *C09K 11/71* (2013.01); *C09K 11/7738* (2013.01); *H01L 33/502* (2013.01); *Y02B 20/181* (2013.01)

(58) Field of Classification Search
CPC ............ C09K 11/0861; C09K 11/0872; C09K 11/7738; C09K 11/71
See application file for complete search history.

(56) References Cited

U.S. PATENT DOCUMENTS 3,484,383 A * 12/1969 Hoffman ............ C09K 11/7738
                                            252/301.4 R
3,721,849 A *  3/1973 Gallaro ................... H01J 29/26
                                                    313/473

FOREIGN PATENT DOCUMENTS

CN       1775902 A      5/2006
CN     101818065 A      9/2010
(Continued)

OTHER PUBLICATIONS

Hoffman. Eu Activation in Some Alkaline Earth Strontium Phosphate Compounds. J. Electrochem. Sot.: Solid State Science 1968. pp. 560-563 (Year: 1968).*

(Continued)

Primary Examiner — Matthew E. Hoban
(74) Attorney, Agent, or Firm — Cesari & McKenna, LLP

(57) ABSTRACT

This invention provides an orange-yellow-emitting phosphor, the preparation method and the use thereof. This orange-yellow-emitting phosphor has a general formula represented by formula I:

$$Sr_{9-a-b-x}M_aMg_{1.5+b}(PO_4)_7 : xEu^{2+} \quad \text{formula I}$$

wherein in formula I, said M is one or two of Ca and Ba; and $0.001 \leq x \leq 0.9$, $0 \leq a \leq 1.0$, $0 \leq b \leq 2.3$. This orange-yellow-emitting phosphor uses a phosphate as the host material and $Eu^{2+}$ ions as activation ions. The chemical properties of the (Continued)

phosphor are stable. The phosphor has relatively wide excitation band and emission band. And the red component in its emission spectrum is abundant, therefore, coupling the blue InGaN chip with the orange-yellow-emitting phosphor provided by this invention can obtain warm white light. The phosphor is radiation free, therefore, it will not be harmful to the environment. It is indicated by experimental results that this orange-yellow-emitting phosphor can be effectively excited by light at a wavelength of 250-500 nm and emits a wide peak at 470-850 nm, wherein the main emission peaks lie at about 523 nm and 620 nm. This preparation method is simple, and the cost is relatively low, so it is amenable to industrial production.

19 Claims, 2 Drawing Sheets

(56) References Cited

FOREIGN PATENT DOCUMENTS

| CN | 102051176 A | 5/2011 |
|---|---|---|
| CN | 103773372 A | 5/2014 |
| CN | 104498031 A | 4/2015 |

OTHER PUBLICATIONS

Guoxiong et al "Synthesis and Photoluminescence of $Ca_{10}K(PO_4)_7:Eu^{3+}$ Phosphor" New Chemical Materials vol. 40, pp. 46-48, 2012.

Huang et al "Near UV-Pumped Yellow-Emitting $Sr_8MgSc(PO_4)_7:Eu^{2+}$ Phosphor for White-Light LEDs with Excellent Color Rendering Index" Journal of Materials Chemistry vol. 21, pp. 5645-5649, 2011.

Chien-Hao Huang et al., Sr8MgGd(PO4)7:Eu2+: yellow-emitting phosphor for application in near-ultraviolet-emitting diode based white-light LEDs, The Royal Society of Chemistry, Jul. 2012.

Chien-Hao Huang et al., Novel Eu2+-Activated Yellow-Emitting Sr8MgLu(PO4)7 Phosphors for White-Light Near-Ultraviolet LEDs, Materials Express, vol. 2, No. 4, 2012.

Search Report and Final Examination Report with Notice of Eligibility for Grant issued in Singapore Patent Application 11201801730P, dated Mar. 18, 2019.

* cited by examiner

ORANGE-YELLOW-EMITTING PHOSPHOR FOR LEDS, PREPARATION METHOD AND USE THEREOF

CROSS REFERENCE TO RELATED APPLICATIONS

This application is the National Stage of International Application No. PCT/CN2015/094654, filed on Nov. 16, 2015, which claims the benefit of Chinese Application No. 201510556027.3, filed on Sep. 2, 2015. The contents of both applications are hereby incorporated by reference in their entirety.

FIELD OF THE INVENTION

This invention relates to the field of luminescence materials, and particularly to an orange-yellow-emitting phosphor for LEDs as well as the preparation method and the use thereof.

BACKGROUND OF THE INVENTION

A light-emitting diode (LED) is a new semiconductor illumination light source, which has become a hot spot of studies in recent years by virtue of the advantages of good energy-saving property, good environmental friendliness, long service life, high light efficiency, etc., and has a wide range of applications in the fields of displays, lighting lamps, indicator lamps, signal lamps, etc. Phosphors for white light LEDs can be divided into three types: a yellow-emitting phosphor which can be excited by a blue LED chip; three-primary-color (red/green/blue) phosphors which can be excited by near ultraviolet light; and a single-phased white-emitting phosphor which can be excited by near ultraviolet light. Here, there are problems of difficulties in color reabsorption and proportion regulation when a near ultraviolet chip is covered with three-primary-color (red/green/blue) phosphors. Although many new systems have been found and reported about the single-phased white-emitting phosphors, such as $CaIn_2O_4:Eu^{3+}$, $Sr_2SiO_4:EU^{2+}$, $Ca_9Y(PO_4)_7:EU^{2+}$, $Mn^{2+}$, etc., the luminescence efficiencies thereof are still relatively low.

White LEDs using blue InGaN chips as an excitation light source have attracted attention due to their advantages of low energy consumption, long service life, small volume, light weight, compact structure, no pollution, good stability, etc. At present, white light can be achieved by blue-yellow mixed light obtained by exciting a yellow-emitting phosphor $YAG:Ce^{3+}$ using blue InGaN chip as an excitation light. Blue light emitted by the InGaN chip is partly absorbed by the $YAG:Ce^{3+}$ phosphor and converted to yellow emission with a long wavelength, and the unabsorbed blue light and the yellow light emitted by the $YAG:Ce^{3+}$ phosphor are recombined to obtain a white light. However, the white light obtained by this method has a relatively low color rendering index and a relatively high color temperature due to the lack of red component in the spectrum, and is a type of cold white light which is not suitable for the fields of indoor illumination, etc.

In order to achieve the warm white light emission, a typical method is adding sulfur-containing red-emitting phosphors such as $CaS:Eu^{2+}$ and $SrS:Eu^{2+}$ or nitride red-emitting phosphors such as $Sr_2Si_5N_8:Eu^{2+}$ to this system. However, the sulfur-containing red-emitting phosphors are sensitive to moisture and instable in chemical and thermal properties. The preparation of nitrides and oxynitrides is difficult and required high nitrogen pressure, and the cost of this kind of product is high. Therefore, it is not advantageous for large-scale industrial production, such that the application of white LEDs is limited.

SUMMARY OF THE INVENTION

In view of this, an object of this invention is to provide an orange-yellow-emitting phosphor for LEDs, the preparation method and the use thereof. The orange-yellow-emitting phosphor provided by this invention is stable, and can be packaged into LED device with a blue InGaN chip so as to be capable of emitting warm white light.

This invention provides an orange-yellow-emitting phosphor, having a general formula represented by formula I:

$$Sr_{9-a-b-x}M_aMg_{1.5+b}(PO_4)_7:xEu^{2+} \qquad \text{formula I}$$

wherein in formula I, said M is one or two of Ca and Ba; and
0.001≤x≤0.9, 0≤a≤1.0, 0≤b≤2.3.
Preferably, said x is 0.001, 0.01, 0.05, 0.5 or 0.9.
Preferably, said a is 0 or 0.1;
said b is 0, 0.5, 1, 1.5 or 2.0.
Preferably, the orange-yellow-emitting phosphor is specifically:
$Sr_{8.999}Mg_{1.5}(PO_4)_7:0.001Eu^{2+}$;
$Sr_{8.99}Mg_{1.5}(PO_4)_7:0.01Eu^{2+}$;
$Sr_{8.95}Mg_{1.5}(PO_4)_7:0.05Eu^{2+}$;
$Sr_{8.5}Mg_{1.5}(PO_4)_7:0.50Eu^{2+}$;
$Sr_{8.1}Mg_{1.5}(PO_4)_7:0.90Eu^{2+}$;
$Sr_{8.85}Ba_{0.1}Mg_{1.5}(PO_4)_7:0.05Eu^{2+}$;
$Sr_{8.85}Ca_{0.1}Mg_{1.5}(PO_4)_7:0.05Eu^{2+}$;
$Sr_{8.45}Mg_{2.0}(PO_4)_7:0.05Eu^{2+}$;
$Sr_{7.95}Mg_{2.5}(PO_4)_7:0.05EU^{2+}$;
$Sr_{7.45}Mg_{3.0}(PO_4)_7:0.05\ EU^{2+}$;
$Sr_{6.95}Mg_{3.5}(PO_4)_7:0.05Eu^{2+}$.
Preferably, the orange-yellow-emitting phosphor has a particle size of 500-600 meshes.

This invention provides a preparation method for an orange-yellow-emitting phosphor, comprises the steps of:
mixing a Sr-containing compound, a M-containing compound, a Mg-containing compound, a P-containing compound, and a Eu-containing compound to obtain a mixture; and
sintering the mixture to obtain an orange-yellow-emitting phosphor;
the orange-yellow-emitting phosphor having a general formula represented by formula I:

$$Sr_{9-a-b-x}M_aMg_{1.5+b}(PO_4)_7:xEu^{2+} \qquad \text{formula I}$$

wherein, said M is one or two of Ca and Ba; and
0.001≤x≤0.9, 0≤a≤1.0, 0≤b≤2.3.
Preferably, the molar ratio of the Sr-containing compound, the M-containing compound, the Mg-containing compound, the P-containing compound, and the Eu-containing compound is (4.8-8.999):(0-1.0):(1.5-3.8):7:(0.001-0.9).
Preferably, the temperature of the sintering is 800° C.-1500° C.;
the time of the sintering is 2-9 hours.
Preferably, the Sr-containing compound comprises carbonates containing strontium and/or oxides containing strontium;
the M-containing compound comprises a carbonate containing M and/or an oxide containing M;
the Eu-containing compound comprises an oxide containing europium and/or europium oxalate;

the Mg-containing compound comprises one or more of magnesium oxide, magnesium carbonate, and basic magnesium carbonate;

the P-containing compound comprises ammonium dihydrogen phosphate and/or ammonium hydrogen phosphate.

Preferably, the Sr-containing compound is $SrCO_3$.

Preferably, the M-containing compound is $BaCO_3$ or $CaCO_3$.

Preferably, the Eu-containing compound is $Eu_2O_3$.

Preferably, the Mg-containing compound is $Mg(OH)_2 \cdot 4MgCO_3 \cdot 6H_2O$ or MgO.

Preferably, the atmosphere for the sintering is a reducing atmosphere;

the reducing atmosphere comprises carbon monoxide, $H_2$, or a $N_2$—$H_2$ mixed gas.

This invention provides use of the orange-yellow-emitting phosphor of the technical solutions described above or the orange-yellow-emitting phosphor prepared by the preparation method of the technical solutions described above in a light-emitting device.

Preferably, the light-emitting device is a light-emitting diode.

This invention provides an orange-yellow-emitting phosphor, having a general formula represented by formula I:

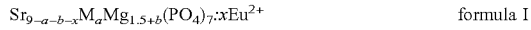

$$Sr_{9-a-b-x}M_aMg_{1.5+b}(PO_4)_7{:}xEu^{2+} \qquad \text{formula I}$$

wherein in formula I, said M is one or two of Ca and Ba; and 0.001≤x≤0.9, 0≤a≤1.0, 0≤b≤2.3. The orange-yellow-emitting phosphor provided by this invention uses a phosphate as the host material and $Eu^{2+}$ ions as activation ions. The chemical properties of the phosphor are stable. The phosphor has relatively wide excitation band and emission band. And the red component in its emission spectrum is abundant, therefore, coupling the blue InGaN chip with the orange-yellow-emitting phosphor provided by this invention can obtain warm white light. The phosphor is radiation free, therefore, it will not be harmful to the environment. It is indicated by experimental results that this orange-yellow-emitting phosphor provided in the invention can be effectively excited by light at a wavelength of 250-500 nm and emits wide peaks at 470-850 nm, wherein the main emission peaks lie at about 523 nm and 620 nm.

Compared to the prior art, the orange-yellow-emitting phosphor provided by this invention contains an abundant red light ingredient, and can be packaged into an LED device with a blue InGaN chip so as to be capable of directly emitting a warm white light without further adding a red-emitting phosphor. Therefore, the new orange-yellow-emitting phosphor provided by this invention may be used in indoor illumination. Furthermore, the emission spectrum of this invention contains an abundant red light ingredient, and can be further used in the fields of plant illumination, etc.

The preparation method provided by this invention has simple process and relatively low cost, and is amenable to industrial production.

DETAILED DESCRIPTION OF THE INVENTION

Figure 1:
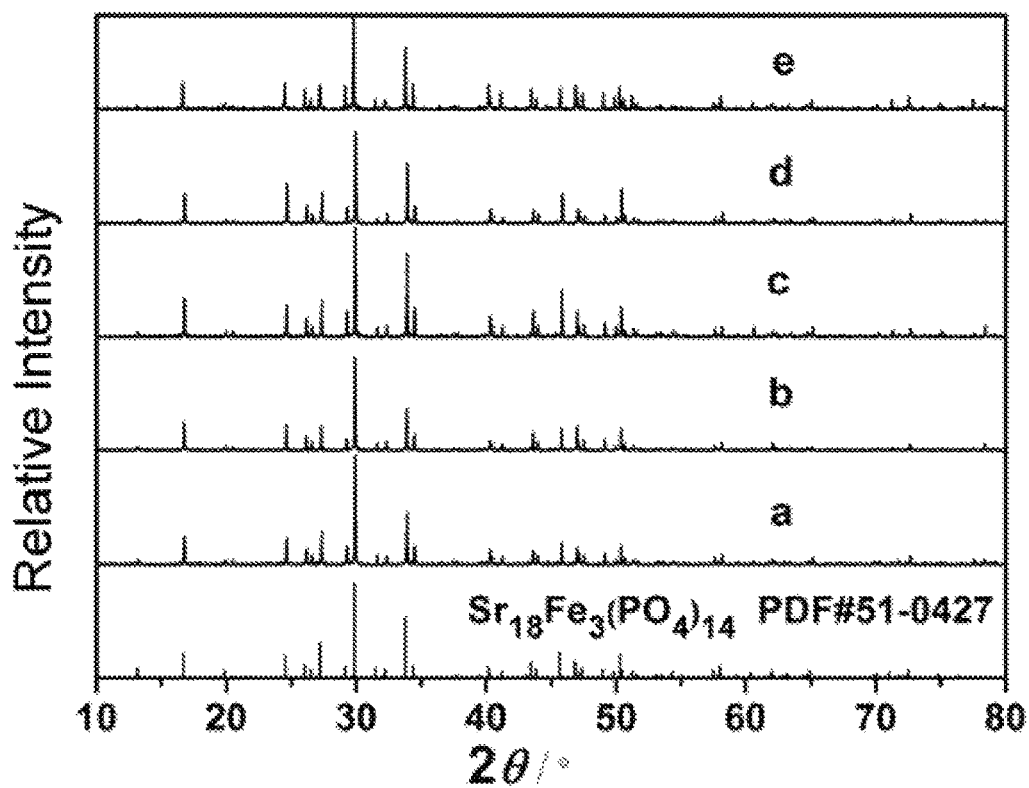
FIG. 1 is XRD diffraction spectrograms of the novel orange-yellow-emitting phosphor prepared in Examples 1, 4, 7, 9, and 12 of this invention and the standard card of $Sr_{18}Fe_3(PO_4)_{14}$.

This invention provides an orange-yellow-emitting phosphor, having a general formula represented by formula I:

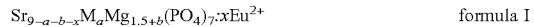

$$Sr_{9-a-b-x}M_aMg_{1.5+b}(PO_4)_7{:}xEu^{2+} \qquad \text{formula I}$$

wherein in formula I, M is one or two of Ca and Ba; 0.001≤x≤0.90, 0≤a≤1.0, 0≤b≤2.3.

The orange-yellow-emitting phosphor provided by this invention has stable chemical properties, and can be packaged into an LED device with a blue InGaN chip so as to be capable of emitting a warm white light.

In this invention, said x is a mole coefficient, and 0.001≤x≤0.9. In a specific embodiment of this invention, said x is specifically 0.001, 0.01, 0.05, 0.5 or 0.9.

Said a is a mole coefficient, and 0≤a≤1.0. In a specific embodiment of this invention, said a is specifically 0 or 0.1.

Said b is a mole coefficient, and 0≤b≤2.3. In a specific embodiment of this invention, said b is specifically 0, 0.5, 1, 1.5 or 2.0.

In this invention, preferably said orange-yellow-emitting phosphor is specifically:

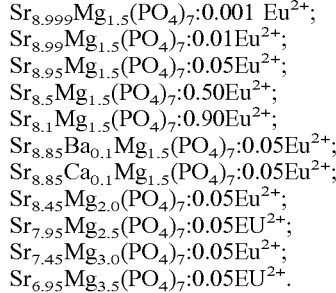

$Sr_{8.999}Mg_{1.5}(PO_4)_7{:}0.001\ Eu^{2+}$;
$Sr_{8.99}Mg_{1.5}(PO_4)_7{:}0.01Eu^{2+}$;
$Sr_{8.95}Mg_{1.5}(PO_4)_7{:}0.05Eu^{2+}$;
$Sr_{8.5}Mg_{1.5}(PO_4)_7{:}0.50Eu^{2+}$;
$Sr_{8.1}Mg_{1.5}(PO_4)_7{:}0.90Eu^{2+}$;
$Sr_{8.85}Ba_{0.1}Mg_{1.5}(PO_4)_7{:}0.05Eu^{2+}$;
$Sr_{8.85}Ca_{0.1}Mg_{1.5}(PO_4)_7{:}0.05Eu^{2+}$;
$Sr_{8.45}Mg_{2.0}(PO_4)_7{:}0.05Eu^{2+}$;
$Sr_{7.95}Mg_{2.5}(PO_4)_7{:}0.05EU^{2+}$;
$Sr_{7.45}Mg_{3.0}(PO_4)_7{:}0.05Eu^{2+}$;
$Sr_{6.95}Mg_{3.5}(PO_4)_7{:}0.05EU^{2+}$.

The phosphor provided by this invention can emit orange-yellow emission. The phosphor provided by this invention can be packaged into an LED device with a blue InGaN chip so as to be capable of emitting a warm white light. Therefore, the orange-yellow-emitting phosphor provided by this invention may be used in indoor illumination. Furthermore, the orange-yellow-emitting phosphor provided by this invention contains an abundant red light ingredient. The red light ingredient may stimulate chlorophyll A and chlorophyll B to perform photosynthesis, and has the functions of stimulating the rooting of the stem section of a plant, the chlorophyll formation, and the carbohydrate accumulation. Besides a plant growing lamp containing a red light ingredient can supplement light to a plant at the time of lacking light, it can stimulate the differentiation of the sprout and more growth of lateral branches in the process of plant growth, accelerate the growth of roots, stems, and leaves, and accelerate the synthesis of carbohydrates and vitamins of the plant, so as to shorten the period of plant growth. Therefore, the orange-yellow-emitting phosphor provided by this invention can be used in the fields of plant illumination, etc.

This invention also provides a preparation method for an orange-yellow-emitting phosphor, comprising the steps of:

mixing a Sr-containing compound, a M-containing compound, a Mg-containing compound, a P-containing compound, and a Eu-containing compound to obtain a mixture; and sintering said mixture to obtain an orange-yellow-emitting phosphor;

said orange-yellow-emitting phosphor having a general formula represented by formula I:

$$Sr_{9-a-b-x}M_aMg_{1.5+b}(PO_4)_7:xEu^{2+} \quad \text{formula I}$$

wherein, said M is one or two of Ca and Ba; $0.001 \leq x \leq 0.9$, $0 \leq a \leq 1.0$, $0 \leq b \leq 2.3$.

Compared to the prior art, the preparation method provided by this invention has simple process and relatively low cost, and is amenable to industrial production.

A Sr-containing compound, a M-containing compound, a Mg-containing compound, a P-containing compound, and a Eu-containing compound are mixed to obtain a mixture in this invention.

In this invention, the molar ratio of the Sr-containing compound, the M-containing compound, the Mg-containing compound, the P-containing compound, and the Eu-containing compound is preferably (4.8-8.999):(0-1.0):(1.5-3.8):7:(0.001-0.9).

In this invention, said Sr-containing compound preferably comprises a carbonate containing strontium and/or an oxide containing strontium. In an embodiment of this invention, said Sr-containing compound is specifically $SrCO_3$.

In this invention, said M-containing compound preferably comprises a carbonate containing M and/or an oxide containing M. In an embodiment of this invention, said M-containing compound is specifically $BaCO_3$ or $CaCO_3$.

Said Eu-containing compound preferably comprises an oxide containing europium and/or europium oxalate. In an embodiment of this invention, said Eu-containing compound is specifically $Eu_2O_3$.

In this invention, said Mg-containing compound preferably comprises one or more of magnesium oxide, magnesium carbonate, and basic magnesium carbonate. In a specific embodiment of this invention, said Mg-containing compound is specifically $Mg(OH)_2 \cdot 4MgCO_3 \cdot 6H_2O$ or MgO.

Said P-containing compound preferably comprises ammonium dihydrogen phosphate and/or ammonium hydrogen phosphate.

In this invention, the sources of the Sr-containing compound, the M-containing compound, the Mg-containing compound, the P-containing compound, and the Eu-containing compound are not particularly limited. The Sr-containing compounds, M-containing compounds, Mg-containing compounds, P-containing compounds, and Eu-containing compounds which are well known by the person skilled in the art may be used. For example, commercially available products may be used.

In this invention, the Sr-containing compound, the M-containing compound, the Mg-containing compound, the P-containing compound, and the Eu-containing compound are preferably ground to obtain a mixture. In this invention, grinding is preferably performed in an agate mortar which is well known by the person skilled in the art.

In this invention, after the mixture is obtained, said mixture is sintered to obtain an orange-yellow-emitting phosphor.

Said orange-yellow-emitting phosphor has a general formula represented by formula I:

$$Sr_{9-a-b-x}M_aMg_{1.5+b}(PO_4)_7:xEu^{2+} \quad \text{formula I}$$

wherein in formula I, said M is one or two of Ca and Ba; $0.001 \leq x \leq 0.9$, $0 \leq a \leq 1.0$, $0 \leq b \leq 2.3$.

In this invention, the temperature of said sintering is preferably 800° C.-1500° C., more preferably 1100° C.-1450° C.; the time of said sintering is preferably 2-9 hours, more preferably 2-8 hours.

In this invention, the atmosphere for said sintering is a reducing atmosphere; and said reducing atmosphere comprises carbon monoxide, $H_2$, or a $N_2$—$H_2$ mixed gas.

In this invention, the mixture is preferably placed in a corundum crucible, which is well known by the person skilled in the art, for sintering. In a specific embodiment of this invention, it is preferable to perform sintering by placing the mixture in a smaller corundum crucible and then in a larger corundum crucible with carbon rods filled around. In this invention, a high-temperature furnace, which is well known by the person skilled in the art, is preferably used for sintering. In this invention, the sintered product is preferably cooled to obtain a cooled product. In this invention, the cooling method is not particularly limited, and the technical solutions for cooling, which are well known by the person skilled in the art, may be used for spontaneous cooling. In this invention, the mode of said cooling is preferably natural cooling.

In this invention, the cooled product is preferably ground to obtain an orange-yellow-emitting phosphor. In this invention, the method for said grinding is not particularly limited, and technical solutions for grinding, which are well known by the person skilled in the art, may be used. In this invention, said orange-yellow-emitting phosphor has a particle size of preferably 500-600 meshes. The appearance of the orange-yellow-emitting phosphor obtained in this invention is a light yellow powder.

This invention provides use of the orange-yellow-emitting phosphor of the technical solutions described above or the orange-yellow-emitting phosphor prepared by the preparation method of the technical solutions described above in a light-emitting device.

In this invention, the orange-yellow-emitting phosphor described above is used in a light-emitting device, and said light-emitting device is preferably a light-emitting diode. In this invention, the orange-yellow-emitting phosphor is preferably packaged into an LED device with a blue InGaN chip. In this invention, the method for packaging is not particularly limited, and technical solutions for packaging a phosphor with a blue InGaN chip, which are well known by the person skilled in the art, may be used for the packaging. The packaged LED may directly emit a warm white light without further adding a red-emitting phosphor, and may be used in indoor illumination. Furthermore, the emission spectrum of this invention contains an abundant red light ingredient, and can be further used in the fields of plant illumination, etc.

This invention provides an orange-yellow-emitting phosphor, having a general formula represented by formula I:

$$Sr_{9-a-b-x}M_aMg_{1.5+b}(PO_4)_7:xEu^{2+} \quad \text{formula I}$$

wherein in formula I, said M is one or two of Ca and Ba; and $0.001 \leq x \leq 0.9$, $0 \leq a \leq 1.0$, $0 \leq b \leq 2.3$. The orange-yellow-emitting phosphor provided by this invention uses a phosphate as the host material and $Eu^{2+}$ ions as activation ions. The chemical properties of the phosphor are stable. The phosphor has relatively wide excitation band and emission band. And the red component in its emission spectrum is abundant, therefore, coupling the blue InGaN chip with the orange-yellow-emitting phosphor provided by this invention can obtain warm white light. The chemical properties of the sample are stable. And the phosphor is radiation free, therefore, it will not be harmful to the environment. It is indicated by experimental results that this orange-yellow-emitting phosphor provided in the invention can be effectively excited by light at a wavelength of 250-500 nm and emits wide peaks at 470-850 nm, wherein the main emission peaks lie at about 523 nm and 620 nm.

Compared to the prior art, the orange-yellow-emitting phosphor provided by this invention contains an abundant red light ingredient, and can be packaged into an LED device with a blue InGaN chip so as to be capable of directly emitting a warm white light without further adding a red-emitting phosphor. Therefore, the new orange-yellow-emitting phosphor provided by this invention may be used in indoor illumination. Furthermore, the emission spectrum of this invention contains an abundant red light ingredient, and can be further used in the fields of plant illumination, etc.

In order to further illustrate this invention, the detailed description will be made in conjunction with the Examples below with respect to an orange-yellow-emitting phosphor and the preparation method thereof provided by this invention, but those cannot be construed as limits of the scope protected by this invention.

EXAMPLE 1

$SrCO_3$ (analytically pure), $Mg(OH)_2 \cdot 4MgCO_3 \cdot 6H_2O$ (analytically pure), $NH_4H_2PO_4$ (analytically pure), and $Eu_2O_3$ (99.99%) were used as raw materials, and the molar ratio of those was 8.999:0.3:7:0.0005. The above substances were accurately weighed, sufficiently and uniformly ground in an agate mortar, placed in a corundum crucible and then in a larger corundum crucible with carbon rods filled around, baked in a high-temperature furnace at 1300° C. for 5 hours, naturally cooled to room temperature, and then ground to obtain a light yellow powder sample, the chemical composition of which was $Sr_{8.999}Mg_{1.5}(PO_4)_7:0.001Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

In this invention, the sample obtained in Example 1 was subjected to X-ray diffraction analysis by using an instrument of Bruker/D8-FOCUS X-Ray Diffractometer with a radiation source of Cu Kα1 (λ=1.5405 nm) at scanning range of 2θ=10°-80° and a scanning speed of 8°/minute. FIG. 1 is the XRD diffraction spectrograms of the orange-yellow-emitting phosphors prepared in Examples 1, 4, 7, 9, and 12 of this invention and the standard card of $S_{18}Fe_3(PO_4)_{14}$, wherein the curve a is the XRD profile of $Sr_{8.999}Mg_{1.5}(PO_4)_7:0.001Eu^{2+}$ prepared in Example 1. It can be seen from curve a in FIG. 1 that the orange-yellow-emitting phosphor prepared in Example 1 of this invention has a crystalline phase of $Sr_9Mg_{1.5}(PO_4)_7$, which is consistent with the standard card ($Sr_{18}Fe_3(PO_4)_{14}$ PDF #51-0427).

EXAMPLE 2

$SrCO_3$ (analytically pure), $Mg(OH)_2 \cdot 4MgCO_3 \cdot 6H_2O$ (analytically pure), $NH_4H_2PO_4$ (analytically pure), and $Eu_2O_3$ (99.99%) were used as raw materials, and the molar ratio of those was 8.99:0.3:7:0.005. The above substances were accurately weighed, sufficiently and uniformly ground in an agate mortar, placed in a corundum crucible and then in a larger corundum crucible with carbon rods filled around, baked in a high-temperature furnace at 1300° C. for 5 hours, naturally cooled to room temperature, and then ground to obtain a light yellow powder sample, the chemical composition of which was $Sr_{8.99}Mg_{1.5}(PO_4)_7:0.01Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

EXAMPLE 3

$SrCO_3$ (analytically pure), $Mg(OH)_2 \cdot 4MgCO_3 \cdot 6H_2O$ (analytically pure), $NH_4H_2PO_4$ (analytically pure), and $Eu_2O_3$ (99.99%) were used as raw materials, and the molar ratio of those was 8.95:0.3:7:0.025. The above substances were accurately weighed, sufficiently and uniformly ground in an agate mortar, placed in a corundum crucible and then in a larger corundum crucible with carbon rods filled around, baked in a high-temperature furnace at 1300° C. for 5 hours, naturally cooled to room temperature, and then ground to obtain a light yellow powder sample, the chemical composition of which was $Sr_{8.95}Mg_{1.5}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

Figure 2:
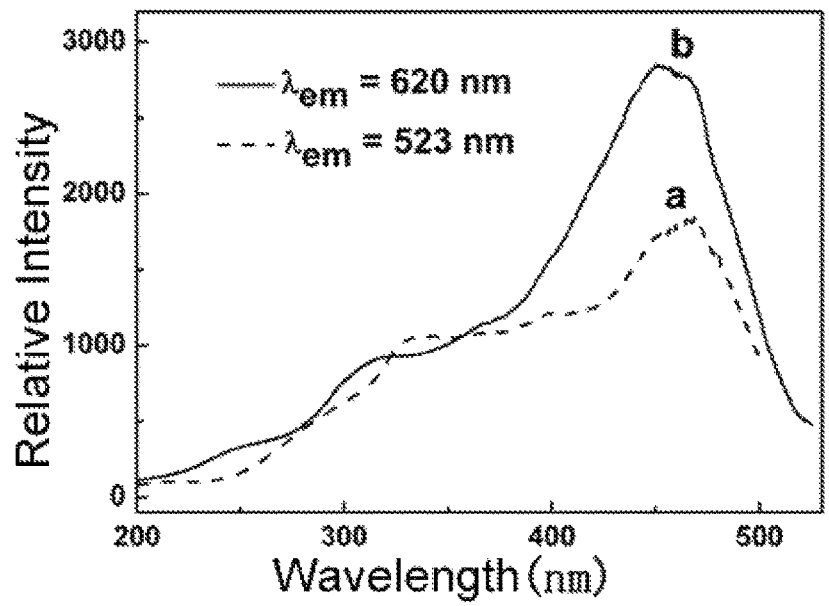
FIG. 2 is the excitation spectra of the orange-yellow-emitting phosphor prepared in this invention when monitored at 523 nm and 620 nm.
Figure 3:
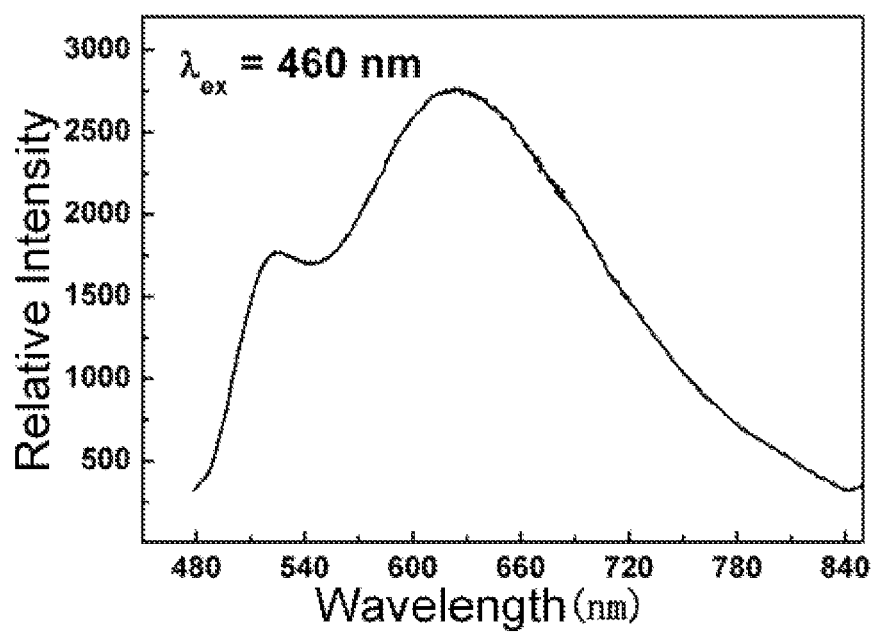
FIG. 3 is the emission spectrum of the orange-yellow-emitting phosphor prepared in this invention under the excitation of 460 nm.

Excitation and emission spectra were measured on a HITACHI F-7000 Spectroflurometer at room temperature with a 150 W Xe lamp as the excitation source, and the results can be seen in FIGS. 2 and 3. FIG. 2 is an excitation spectra of the novel orange-yellow-emitting phosphor prepared in this invention when monitored at 523 nm and 620 nm. In FIG. 2, curve a is the excitation spectrum of the orange-yellow-emitting phosphor prepared in this invention when monitored at the emission peak of 523 nm; and curve b is the excitation spectrum of the orange-yellow-emitting phosphor prepared in this invention when monitored at the emission peak of 620 nm. It can be seen from FIG. 2 that the excitation spectrum of the phosphor provided by this invention is a wide band, which covers from the ultraviolet region to the blue region (250-500 nm), and the main excitation peak lies at about 460 nm. The excitation peak of this invention matches well with the emission peaks of near ultraviolet chips, purple chips, and blue InGaN chips, and the intensity of it is relatively high. It is demonstrated that this invention can be effectively excited by the near ultraviolet, purple, and blue LED light sources.

FIG. 3 is the emission spectrum of the orange-yellow-emitting phosphor prepared in this invention under the excitation of 460 nm. It can be seen from FIG. 3 that the emission spectrum of the orange-yellow-emitting phosphor provided by this invention is a wide peak covering 470 nm-850 nm, and the main emission peaks lie at about 523 nm and 620 nm. The orange-yellow-emitting phosphor provided by this invention can make up the disadvantage of insufficient red light ingredients in the spectrum of the conventional yellow-emitting phosphor YAG:$Ce^{3+}$. Therefore, this phosphor is packaged into an LED device with a blue InGaN chip so as to be capable of achieving the warm white light emission.

EXAMPLE 4

$SrCO_3$ (analytically pure), $Mg(OH)_2 \cdot 4MgCO_3 \cdot 6H_2O$ (analytically pure), $NH_4H_2PO_4$ (analytically pure), and $Eu_2O_3$ (99.99%) were used as raw materials, and the molar ratio of those was 8.5:0.3:7:0.25. The above substances were accurately weighed, sufficiently and uniformly ground in an agate mortar, placed in a corundum crucible and then in a larger corundum crucible with carbon rods filled around, baked in a high-temperature furnace at 1300° C. for 5 hours, naturally cooled to room temperature, and then ground to obtain a light yellow powder sample, the chemical composition of which was $Sr_{8.5}Mg_{1.5}(PO_4)_7:0.50Eu^{2+}$. The chemical properties of the sample are stable. And the phosphor is radiation free, therefore, it will not be harmful to the environment. It has a relatively wide excitation band and can be effectively excited by a light at a wavelength of 250-500 nm. The emission spectrum thereof is a wide band, and main emission peaks lie at about 523 nm and 620 nm.

FIG. 1 is XRD diffraction spectrograms of the novel orange-yellow-emitting phosphor prepared in Examples 1, 4, 7, 9, and 12 of this invention and the standard card of $Sr_{18}Fe_3(PO_4)_{14}$, wherein curve b is the XRD profile of $Sr_{8.5}Mg_{1.5}(PO_4)_7:0.50Eu^{2+}$ prepared in Example 4. It can be seen from curve b in FIG. 1 that the orange-yellow-emitting phosphor prepared in Example 4 of this invention has a crystalline phase of $Sr_9Mg_{1.5}(PO_4)_7$, which is consistent with the standard card ($Sr_{18}Fe_3(PO_4)_{14}$ PDF #51-0427).

EXAMPLE 5

$SrCO_3$ (analytically pure), $Mg(OH)_2 \cdot 4MgCO_3 \cdot 6H_2O$ (analytically pure), $NH_4H_2PO_4$ (analytically pure), and $Eu_2O_3$ (99.99%) were used as raw materials, and the molar ratio of those was 8.1:0.3:7:0.45. The above substances were accurately weighed, sufficiently and uniformly ground in an agate mortar, placed in a corundum crucible and then in a larger corundum crucible with carbon rods filled around, baked in a high-temperature furnace at 1300° C. for 5 hours, naturally cooled to room temperature, and then ground to obtain a light yellow powder sample, the chemical composition of which was $Sr_{8.1}Mg_{1.5}(PO_4)_7:0.90Eu^{2+}$. The chemical properties of the sample are stable. And the phosphor is radiation free, therefore, it will not be harmful to the environment. It has a relatively wide excitation band and can be effectively excited by a light at a wavelength of 250-500 nm. The emission spectrum thereof is a wide band, and the main emission peaks lie at about 523 nm and 620 nm.

EXAMPLE 6

$SrCO_3$ (analytically pure), $Mg(OH)_2 \cdot 4MgCO_3 \cdot 6H_2O$ (analytically pure), $NH_4H_2PO_4$ (analytically pure), and $Eu_2O_3$ (99.99%) were used as raw materials, and the molar ratio of those was 8.95:0.3:7:0.025. The above substances were accurately weighed, sufficiently and uniformly ground in an agate mortar, placed in a corundum crucible and then in a larger corundum crucible with carbon rods filled around, baked in a high-temperature furnace at 1100° C. for 8 hours, naturally cooled to room temperature, and then ground to obtain a light yellow powder sample, the chemical composition of which was $Sr_{8.95}Mg_{1.5}(PO_4)_7:0.05Eu^{2+}$. The chemical properties of the sample are stable. And the phosphor is radiation free, therefore, it will not be harmful to the environment. It has a relatively wide excitation band and can be effectively excited by a light at a wavelength of 250-500 nm. The emission spectrum thereof is a wide band, and the main emission peaks lie at about 523 nm and 620 nm.

EXAMPLE 7

$SrCO_3$ (analytically pure), $Mg(OH)_2 \cdot 4MgCO_3 \cdot 6H_2O$ (analytically pure), $NH_4H_2PO_4$ (analytically pure), and $Eu_2O_3$ (99.99%) were used as raw materials, and the molar ratio of those was 8.95:0.3:7:0.025. The above substances were accurately weighed, sufficiently and uniformly ground in an agate mortar, placed in a corundum crucible and then in a larger corundum crucible with carbon rods filled around, baked in a high-temperature furnace at 1250° C. for 6 hours, naturally cooled to room temperature, and then ground to obtain a light yellow powder sample, the chemical composition of which was $Sr_{8.95}Mg_{1.5}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

FIG. 1 is XRD diffraction spectrograms of the novel orange-yellow-emitting phosphor prepared in Examples 1, 4, 7, 9, and 12 of this invention and the standard card of $Sr_{18}Fe_3(PO_4)_{14}$, wherein curve c is the XRD profile of $Sr_{8.95}Mg_{1.5}(PO_4)_7:0.05Eu^{2+}$ prepared in this Example 7. It can be seen from curve c in FIG. 1 that the orange-yellow-emitting phosphor prepared in Example 7 of this invention has a crystalline phase of $Sr_9Mg_{1.5}(PO_4)_7$, which is consistent with the standard card ($Sr_{18}Fe_3(PO_4)_{14}$ PDF #51-0427).

EXAMPLE 8

$SrCO_3$ (analytically pure), $Mg(OH)_2 \cdot 4MgCO_3 \cdot 6H_2O$ (analytically pure), $NH_4H_2PO_4$ (analytically pure), and $Eu_2O_3$ (99.99%) were used as raw materials, and the molar ratio of those was 8.95:0.3:7:0.025. The above substances were accurately weighed, sufficiently and uniformly ground in an agate mortar, placed in a corundum crucible and then in a larger corundum crucible with carbon rods filled around, baked in a high-temperature furnace at 1450° C. for 3 hours, naturally cooled to room temperature, and then ground to obtain a light yellow powder sample, the chemical composition of which was $Sr_{8.95}Mg_{1.5}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

EXAMPLE 9

$SrCO_3$ (analytically pure), $Mg(OH)_2 \cdot 4MgCO_3 \cdot 6H_2O$ (analytically pure), $NH_4H_2PO_4$ (analytically pure), and $Eu_2O_3$ (99.99%) were used as raw materials, and the molar ratio of those was 8.95:0.3:7:0.025. The above substances were accurately weighed, sufficiently and uniformly ground in an agate mortar, placed in a corundum crucible, baked in a tube furnace under a $N_2$—$H_2$ mixed gas at 1300° C. for 5 hours, naturally cooled to room temperature, and then ground to obtain a light yellow powder sample, the chemical composition of which was $Sr_{8.95}Mg_{1.5}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

FIG. 1 is XRD diffraction spectrograms of the novel orange-yellow-emitting phosphor prepared in Examples 1, 4, 7, 9, and 12 of this invention and the standard card of $Sr_{18}Fe_3(PO_4)_{14}$, wherein curve d is the XRD profile of $Sr_{8.95}Mg_{1.5}(PO_4)_7:0.05Eu^{2+}$ prepared in this Example 9. It can be seen from curve d in FIG. 1 that the orange-yellow-emitting phosphor prepared in Example 9 of this invention has a crystalline phase of $Sr_9Mg_{1.5}(PO_4)_7$, which is consistent with the standard card ($Sr_{18}Fe_3(PO_4)_{14}$ PDF #51-0427).

EXAMPLE 10

$SrCO_3$ (analytically pure), $BaCO_3$ (analytically pure), $Mg(OH)_2.4MgCO_3.6H_2O$ (analytically pure), $NH_4H_2PO_4$ (analytically pure), and $Eu_2O_3$ (99.99%) were used as raw materials, and the molar ratio of those was 8.85:0.1:0.3:7:0.025. The above substances were accurately weighed, sufficiently and uniformly ground in an agate mortar, placed in a corundum crucible and then in a larger corundum crucible with carbon rods filled around, baked in a high-temperature furnace at 1300° C. for 5 hours, naturally cooled to room temperature, and then ground to obtain a light yellow powder sample, the chemical composition of which was $Sr_{8.85}Ba_{0.1}Mg_{1.5}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

EXAMPLE 11

$SrCO_3$ (analytically pure), $CaCO_3$ (analytically pure), $Mg(OH)_2.4MgCO_3.6H_2O$ (analytically pure), $NH_4H_2PO_4$ (analytically pure), and $Eu_2O_3$ (99.99%) were used as raw materials, and the molar ratio of those was 8.85:0.1:0.3:7:0.025. The above substances were accurately weighed, sufficiently and uniformly ground in an agate mortar, placed in a corundum crucible and then in a larger corundum crucible with carbon rods filled around, baked in a high-temperature furnace at 1300° C. for 5 hours, naturally cooled to room temperature, and then ground to obtain a light yellow powder sample, the chemical composition of which was $Sr_{8.85}Ca_{0.1}Mg_{1.5}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

EXAMPLE 12

$SrCO_3$ (analytically pure), $Mg(OH)_2.4MgCO_3.6H_2O$ (analytically pure), $NH_4H_2PO_4$ (analytically pure), and $Eu_2O_3$ (99.99%) were used as raw materials, and the molar ratio of those was 8.45:0.4:7:0.025. The above substances were accurately weighed, sufficiently and uniformly ground in an agate mortar, placed in a corundum crucible and then in a larger corundum crucible with carbon rods filled around, baked in a high-temperature furnace at 1200° C. for 5 hours, naturally cooled to room temperature, and then ground to obtain a light yellow powder sample, the chemical composition of which was $Sr_{8.45}Mg_{2.0}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

FIG. 1 is XRD diffraction spectrograms of the novel orange-yellow-emitting phosphor prepared in Examples 1, 4, 7, 9, and 12 of this invention and the standard card of $Sr_{18}Fe_3(PO_4)_{14}$, wherein curve e is the XRD profile of $Sr_{8.45}Mg_{2.0}(PO_4)_7:0.05Eu^{2+}$ prepared in this Example 12. It can be seen from curve e in FIG. 1 that the orange-yellow-emitting phosphor prepared in Example 12 of this invention has a crystalline phase of $Sr_9Mg_{1.5}(PO_4)_7$, which is consistent with the standard card ($Sr_{18}Fe_3(PO_4)_{14}$ PDF #51-0427).

EXAMPLE 13

$SrCO_3$ (analytically pure), $Mg(OH)_2.4MgCO_3.6H_2O$ (analytically pure), $NH_4H_2PO_4$ (analytically pure), and $Eu_2O_3$ (99.99%) were used as raw materials, and the molar ratio of those was 7.95:0.5:7:0.025. The above substances were accurately weighed, sufficiently and uniformly ground in an agate mortar, placed in a corundum crucible and then in a larger corundum crucible with carbon rods filled around, baked in a high-temperature furnace at 1150° C. for 5 hours, naturally cooled to room temperature, and then ground to obtain a light yellow powder sample, the chemical composition of which was $Sr_{7.95}Mg_{2.5}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

EXAMPLE 14

$SrCO_3$ (analytically pure), $Mg(OH)_2.4MgCO_3.6H_2O$ (analytically pure), $NH_4H_2PO_4$ (analytically pure), and $Eu_2O_3$ (99.99%) were used as raw materials, and the molar ratio of those was 7.45:0.6:7:0.025. The above substances were accurately weighed, sufficiently and uniformly ground in an agate mortar, placed in a corundum crucible and then in a larger corundum crucible with carbon rods filled around, baked in a high-temperature furnace at 1100° C. for 5 hours, naturally cooled to room temperature, and then ground to obtain a light yellow powder sample, the chemical composition of which was $Sr_{7.45}Mg_{3.0}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

EXAMPLE 15

$SrCO_3$ (analytically pure), $Mg(OH)_2.4MgCO_3.6H_2O$ (analytically pure), $NH_4H_2PO_4$ (analytically pure), and $Eu_2O_3$ (99.99%) were used as raw materials, and the molar ratio of those was 6.95:0.7:7:0.025. The above substances were accurately weighed, sufficiently and uniformly ground in an agate mortar, placed in a corundum crucible and then in a larger corundum crucible with carbon rods filled around, baked in a high-temperature furnace at 1100° C. for 5 hours, naturally cooled to room temperature, and then ground to obtain a light yellow powder sample, the chemical composition of which was $Sr_{6.95}Mg_{3.5}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

EXAMPLE 16

$SrCO_3$ (analytically pure), MgO (analytically pure), $NH_4H_2PO_4$ (analytically pure), and $Eu_2O_3$ (99.99%) were used as raw materials, and the molar ratio of those was 8.95:1.5:7:0.025. The above substances were accurately weighed, sufficiently and uniformly ground in an agate mortar, placed in a corundum crucible and then in a larger corundum crucible with carbon rods filled around, baked in a high-temperature furnace at 1300° C. for 5 hours, naturally cooled to room temperature, and then ground to obtain a light yellow powder sample, the chemical composition of which was $Sr_{8.95}Mg_{1.5}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

EXAMPLE 17

$SrCO_3$ (analytically pure), $Mg(OH)_2 \cdot 4MgCO_3 \cdot 6H_2O$ (analytically pure), $(NH_4)_2HPO_4$ (analytically pure), and $Eu_2O_3$ (99.99%) were used as raw materials, and the molar ratio of those was 8.95:0.3:7:0.025. The above substances were accurately weighed, sufficiently and uniformly ground in an agate mortar, placed in a corundum crucible and then in a larger corundum crucible with carbon rods filled around, baked in a high-temperature furnace at 1300° C. for 5 hours, naturally cooled to room temperature, and then ground to obtain a light yellow powder sample, the chemical composition of which was $Sr_{8.95}Mg_{1.5}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

EXAMPLE 18

$SrCO_3$ (analytically pure), MgO (analytically pure), $(NH_4)_2HPO_4$ (analytically pure), and $Eu_2O_3$ (99.99%) were used as raw materials, and the molar ratio of those was 8.95:1.5:7:0.025. The above substances were accurately weighed, sufficiently and uniformly ground in an agate mortar, placed in a corundum crucible and then in a larger corundum crucible with carbon rods filled around, baked in a high-temperature furnace at 1300° C. for 5 hours, naturally cooled to room temperature, and then ground to obtain a light yellow powder sample, the chemical composition of which was $Sr_{8.95}Mg_{1.5}(PO_4)_7:0.05Eu^{2+}$. The chemical properties of the sample are stable. And the phosphor is radiation free, therefore, it will not be harmful to the environment. It has a relatively wide excitation band and can be effectively excited by light at a wavelength of 250-500 nm. The emission spectrum thereof is a wide band, and the main emission peaks lie at about 523 nm and 620 nm.

It can be known from the above Examples that this invention provides an orange-yellow-emitting phosphor, having a general formula represented by formula I:

$$Sr_{9-a-b-x}M_aMg_{1.5+b}(PO_4)_7:xEu^{2+} \qquad \text{formula I}$$

wherein in formula I, said M is one or two of Ca and Ba; $0.001 \leq x \leq 0.9$, $0 \leq a \leq 1.0$, $0 \leq b \leq 2.3$. The orange-yellow-emitting phosphor provided by this invention uses a phosphate as the host material and $Eu^{2+}$ ions as activation ions. The chemical properties of the phosphor are stable. The phosphor has a relatively wide excitation band and emission band. And the red component in its emission spectrum is abundant, therefore, coupling the blue InGaN chip with the orange-yellow-emitting phosphor provided by this invention can obtain warm white light. The phosphor is radiation free, therefore, it will not be harmful to the environment. It is indicated by experimental results that this orange-yellow-emitting phosphor provided in the invention can be effectively excited by light at a wavelength of 250-500 nm and emits a wide peak at 470-850 nm, wherein the main emission peaks lie at about 523 nm and 620 nm.

Compared to the prior art, the orange-yellow-emitting phosphor provided by this invention contains an abundant red light ingredient, and can be packaged into an LED device with a blue InGaN chip so as to be capable of directly emitting warm white light without further adding a red-emitting phosphor. Therefore, the new orange-yellow-emitting phosphor provided by this invention may be used in indoor illumination. Furthermore, the emission spectrum of this invention contains an abundant red light ingredient, and can be further used in the fields of plant illumination, etc.

Those described above are merely preferred embodiments of this invention, and it is to be indicated that, with respect to the person skilled in the art, various improvements and modifications can also be made without departing from the principle of this invention. These improvements and modifications should be considered as the scope protected by this invention.

What is claimed is:

1. An orange-yellow-emitting phosphor, having a general formula represented by formula I:

$$Sr_{9-a-b-x}M_aMg_{1.5+b}(PO_4)_7:xEu^{2+} \qquad \text{formula I}$$

wherein in formula I, said M is one or two of Ca and Ba; and
$0.001 \leq x \leq 0.9$, $0 \leq a \leq 1.0$, $0 \leq b \leq 2.3$.

2. The orange-yellow-emitting phosphor according to claim 1, wherein said x is 0.001, 0.01, 0.05, 0.5 or 0.9.

3. The orange-yellow-emitting phosphor according to claim 1, wherein said a is 0.1; and
said b is 0, 0.5, 1, 1.5 or 2.0.

4. The orange-yellow-emitting phosphor according to claim 1, wherein the orange-yellow-emitting phosphor is specifically:
$Sr_{8.85}Ba0.1Mg_{1.5}(PO_4)_7:0.05Eu^{2+}$ or
$Srs_{8.85}Ca_{0.1}Mg_{1.5}(PO_4)_7:0.05Eu^{2+}$.

5. The orange-yellow-emitting phosphor according to claim 1, wherein the orange-yellow-emitting phosphor has a particle size of 500-600 meshes.

6. A preparation method for an orange-yellow-emitting phosphor, comprising the steps of:
mixing a Sr-containing compound, a M-containing compound, a Mg-containing compound, a P-containing compound, and a Eu-containing compound to obtain a mixture; and
sintering the mixture to obtain an orange-yellow-emitting phosphor;
wherein the orange-yellow-emitting phosphor has a general formula represented by formula I:

$$Sr_{9-a-b-x}M_aMg_{1.5+b}(PO_4)_7:xEu^{2+} \qquad \text{formula I}$$

wherein, said M is one or two of Ca and Ba; and 0.001≤x≤0.9, 0≤a≤1.0, 0≤b≤2.3.

7. The preparation method according to claim 6, wherein the molar ratio of the Sr-containing compound, the M-containing compound, the Mg-containing compound, the P-containing compound, and the Eu-containing compound is (4.8-8.999):(0-1.0 excluding 0):(1.5-3.8):7:(0.001-0.9).

8. The preparation method according to claim 6, wherein the temperature of the sintering is 800° C.-1500° C.; and the time of the sintering is 2-9 hours.

9. The preparation method according to claim 6, wherein the Sr-containing compound comprises a carbonate containing strontium and/or an oxide containing strontium;
the M-containing compound comprises a carbonate containing M and/or an oxide containing M;
the Eu-containing compound comprises an oxide containing europium and/or europium oxalate;
the Mg-containing compound comprises one or more of magnesium oxide, magnesium carbonate, and basic magnesium carbonate; and
the P-containing compound comprises ammonium dihydrogen phosphate and/or ammonium hydrogen phosphate.

10. The preparation method according to claim 6, wherein the Sr-containing compound is $SrCO_3$.

11. The preparation method according to claim 6, wherein the M-containing compound is $BaCO_3$ or $CaCO_3$.

12. The preparation method according to claim 6, wherein the Eu-containing compound is $Eu_2O_3$.

13. The preparation method according to claim 6, wherein the Mg-containing compound is $Mg(OH)_2.4MgCO_3.6H_2O$ or MgO.

14. The preparation method according to claim 6, wherein the atmosphere for the sintering is a reducing atmosphere; and the reducing atmosphere comprises carbon monoxide, $H_2$, or a $N_2$—$H_2$ mixed gas.

15. A light-emitting device comprising the orange-yellow-emitting phosphor of claim 1.

16. The light-emitting device according to claim 15, wherein said x is 0.001, 0.01, 0.05, 0.5 or 0.9.

17. The light-emitting device according to claim 15, wherein said a is 0.1; and said b is 0, 0.5, 1, 1.5 or 2.0.

18. The light-emitting device according to claim 15, wherein the orange-yellow-emitting phosphor is specifically:
$Sr_{8.85}Ba_{0.1}Mg_{1.5}(PO_4)_7:0.05Eu^{2+}$ or
$Sr_{8.85}Ca_{0.1}Mg_{1.5}(PO_4)_7:0.05Eu^{2+}$.

19. The light-emitting device according to claim 15, wherein the orange-yellow-emitting phosphor has a particle size of 500-600 meshes.

* * * * *